United States Patent
Kaemmer et al.

(10) Patent No.: US 9,478,555 B2
(45) Date of Patent: Oct. 25, 2016

(54) METHOD FOR PROCESSING A CARRIER, A CARRIER, AND A SPLIT GATE FIELD EFFECT TRANSISTOR STRUCTURE

(71) Applicant: Infineon Technologies AG, Neubiberg (DE)

(72) Inventors: Kerstin Kaemmer, Radebeul (DE); Thomas Bertrams, Dresden (DE); Henning Feick, Dresden (DE); Olaf Storbeck, Dresden (DE); Matthias Schmeide, Langebrueck (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/927,608

(22) Filed: Oct. 30, 2015

(65) Prior Publication Data

US 2016/0049411 A1 Feb. 18, 2016

Related U.S. Application Data

(62) Division of application No. 14/309,968, filed on Jun. 20, 2014, now Pat. No. 9,202,815.

(51) Int. Cl.
| | |
|---|---|
| *H01L 27/11* | (2006.01) |
| *H01L 27/112* | (2006.01) |
| *H01L 21/02* | (2006.01) |
| *H01L 29/51* | (2006.01) |
| *H01L 23/525* | (2006.01) |
| *H01L 29/423* | (2006.01) |
| *H01L 21/265* | (2006.01) |
| *H01L 21/28* | (2006.01) |

(52) U.S. Cl.
CPC ... *H01L 27/11206* (2013.01); *H01L 21/02233* (2013.01); *H01L 21/26506* (2013.01); *H01L 21/2822* (2013.01); *H01L 21/28211* (2013.01); *H01L 23/5256* (2013.01); *H01L 29/42368* (2013.01); *H01L 29/513* (2013.01); *H01L 2924/0002* (2013.01)

(58) Field of Classification Search
CPC .................. H01L 2924/0002; H01L 2924/00; H01L 21/02233; H01L 21/26506; H01L 21/28211; H01L 21/2822; H01L 23/5256; H01L 27/11206; H01L 29/42368; H01L 29/513
USPC ......... 257/147, 530, 355, 300, 50, 316, 410, 257/379; 438/131, 132, 266, 594, 592, 286, 438/265

See application file for complete search history.

(56) References Cited

U.S. PATENT DOCUMENTS

| | | | | |
|---|---|---|---|---|
| 4,897,368 A | * | 1/1990 | Kobushi | ........... H01L 21/28052 148/DIG. 114 |
| 5,278,087 A | * | 1/1994 | Jenq | ................. H01L 29/42324 148/DIG. 1 |
| 5,311,039 A | * | 5/1994 | Kimura | ............... H01L 23/5252 257/50 |

(Continued)

*Primary Examiner* — Mohammed Shamsuzzaman
(74) *Attorney, Agent, or Firm* — Viering, Jentschura & Partner mbB

(57) ABSTRACT

According to various embodiments, a method for processing a carrier may include: doping a carrier with fluorine such that a first surface region of the carrier is fluorine doped and a second surface region of the carrier is at least one of free from the fluorine doping or less fluorine doped than the first surface region; and oxidizing the carrier to grow a first gate oxide layer from the first surface region of the carrier with a first thickness and simultaneously from the second surface region of the carrier with a second thickness different from the first thickness.

8 Claims, 7 Drawing Sheets

(56) References Cited

U.S. PATENT DOCUMENTS

| | | | | |
|---|---|---|---|---|
| 5,858,840 A * | 1/1999 | Hsieh | H01L 29/66825 | 257/E21.422 |
| 6,242,308 B1 * | 6/2001 | Hsieh | H01L 27/115 | 257/E21.682 |
| 6,312,989 B1 * | 11/2001 | Hsieh | H01L 27/11521 | 257/E21.682 |
| 7,205,603 B2 * | 4/2007 | Chuang | H01L 21/28273 | 257/316 |
| 7,642,138 B2 * | 1/2010 | Kurjanowicz | G11C 17/16 | 257/E21.625 |
| 7,880,211 B2 * | 2/2011 | Shin | H01L 23/5254 | 257/300 |
| 8,822,291 B2 * | 9/2014 | Zhang | H01L 21/26506 | 257/340 |
| 8,975,701 B2 * | 3/2015 | Hong | H01L 21/02532 | 257/355 |
| 2004/0004269 A1 * | 1/2004 | Fifield | H01L 23/5252 | 257/530 |
| 2004/0156234 A1 * | 8/2004 | Peng | G11C 17/12 | 365/177 |
| 2006/0292755 A1 * | 12/2006 | Parris | H01L 23/5252 | 438/132 |
| 2015/0054048 A1 * | 2/2015 | Loiko | H01L 29/42328 | 257/316 |
| 2015/0179821 A1 * | 6/2015 | Min | H01L 29/512 | 257/410 |

* cited by examiner

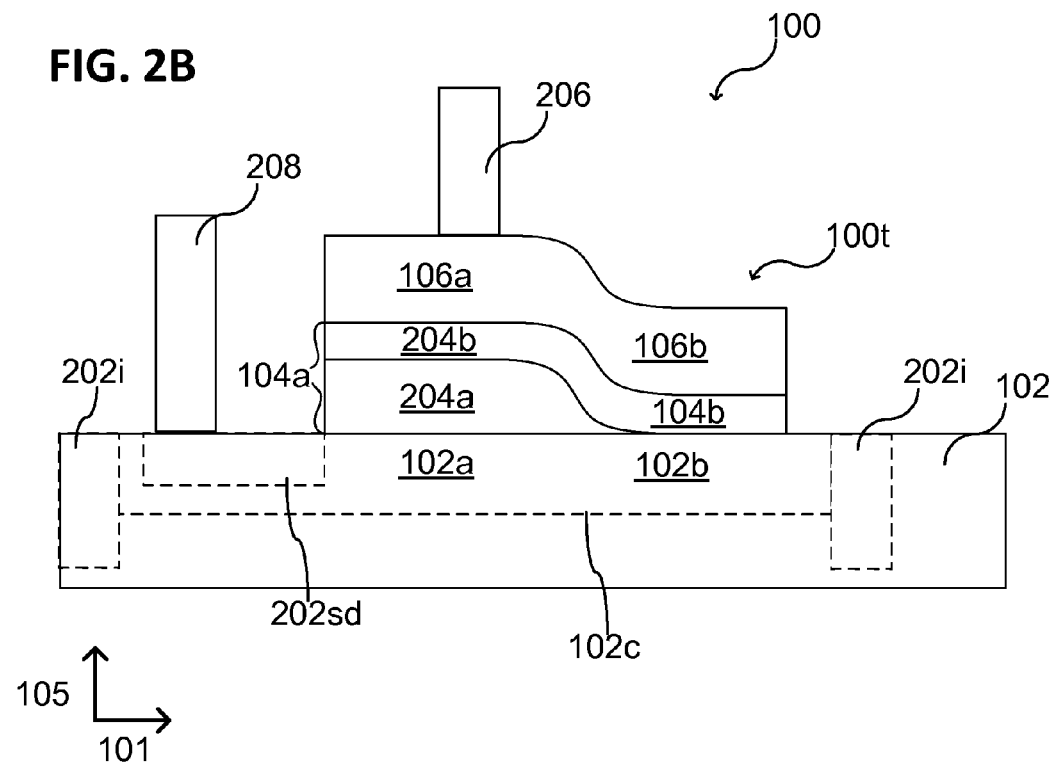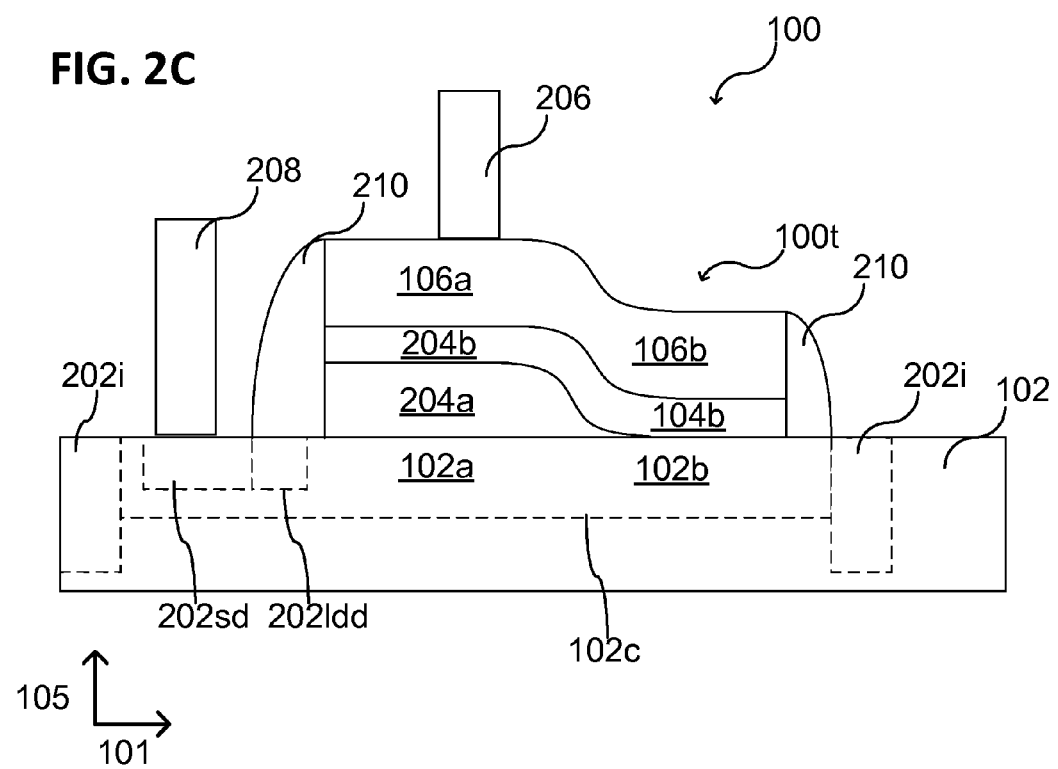

METHOD FOR PROCESSING A CARRIER, A CARRIER, AND A SPLIT GATE FIELD EFFECT TRANSISTOR STRUCTURE

CROSS-REFERENCE TO RELATED APPLICATIONS

The present application is a divisional of U.S. patent application Ser. No. 14/309,968 filed Jun. 20, 2014, the entirety of which is herein incorporated by reference.

TECHNICAL FIELD

Various embodiments relate generally to a method for processing a carrier, a carrier, and a split gate field effect transistor structure.

BACKGROUND

In general, a programmable read-only memory (PROM) or a field programmable read-only memory (FPROM) or a one-time programmable (OTP) non-volatile memory (NVM) may be manufactured in semiconductor technology by a fuse or a so-called antifuse. PROMs, FPROMs, or OTP NVMs may be used in a digital electronic device to store permanent data, e.g. in microcontrollers, wireless communication devices, mobile phones, tablets, radio-frequency identification tags, medical devices, and various other consumer electronics products and automotive electronics products. The data may be programmed into a PROM, a FPROM, or an OTP NVM after the manufacture, e.g. in the field or after testing using for example a suitable programming device. An antifuse-based one-time programmable (OTP) non-volatile memory (NVM) may be realized by a single field effect transistor structure (1T) manufactured in standard-logic CMOS-technology, wherein the single field effect transistor structure includes a split-gate structure providing the antifuse.

SUMMARY

According to various embodiments, a method for processing a carrier may be provided, the method including: doping a carrier with fluorine such that a first surface region of the carrier is fluorine doped and a second surface region of the carrier is free from the fluorine doping or less fluorine doped than the first surface region; and oxidizing the carrier to grow a first gate oxide layer from the first surface region of the carrier with a first thickness and simultaneously from the second surface region of the carrier with a second thickness different from the first thickness.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2C show, respectively, a schematic cross sectional view of a split gate field effect transistor structure on a carrier, according to various embodiments;

DESCRIPTION

Figure 1:
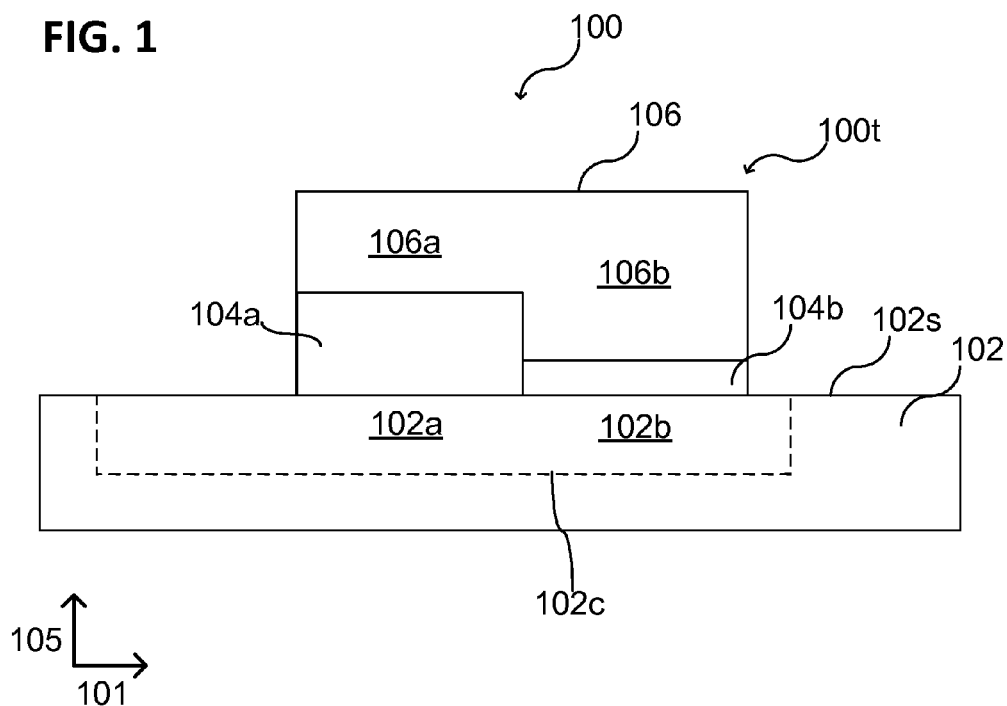
FIG. 1 shows a schematic cross sectional view of a split gate field effect transistor structure on a carrier, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier) or "laterally" next to, may be used herein to mean an extension or a positional relationship along a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support on which the layer is deposited. If the surface of the support is parallel to the surface of the carrier (e.g. to the main processing surface) the "thickness" of the layer deposited on the support may be the same as the height of the layer.

In general, an electronic device may include different types of transistor structures, e.g. different types of field effect transistors, depending on the desired functions, which are to be taken over by the transistors. The different types of field effect transistors (FETs) on a carrier may be fabricated in the same semiconductor technology, e.g. in MOS technology (metal-oxide-semiconductor technology) or in CMOS technology (complementary metal-oxide-semiconductor technology) as MOS-FETs.

According to various embodiments, a carrier may include a first type of field effect transistors and a second type of field effect transistors different from the first type of field effect transistors, e.g. the two types of field effect transistors may differ in the thickness of the gate insulation layer (gate oxide layer) separating the gate of the respective field effect transistor from the body region of the carrier (the channel) below the gate. Further, the first type of field effect transistors may have a first gate insulation layer (e.g. a single layer gate oxide or a first gate insulation layer structure), e.g. with a thickness less than about 3.5 nm, e.g. with a thickness in the range from about 1 nm to about 3 nm. The first type of field effect transistors may for example provide low voltage MOSFETs for logic circuits (e.g. for logic cells in the core of a standard CMOS chip), e.g. with an operating voltage (e.g. applied at the gate to switch the field effect transistor) less than about 2 V, e.g. less than about 1.5 V. Further, the second type of field effect transistors may have a second gate insulation layer (e.g. a double layer gate oxide or a second gate insulation layer structure), e.g. with a thickness greater than about 3.5 nm, e.g. with a thickness in the range from about 4 nm to about 10 nm. The second type of field effect transistors may, for example, provide high voltage MOSFETs for peripheral circuits (e.g. for input/output (I/O) cells of a standard CMOS chip), e.g. with an operating voltage in the range from about 3 V to about 20 V, e.g. in the range from about 5 V to about 14 V. In this regard, the first type of field effect transistors and the second type of field effect transistors may be manufactured by using a cost and time efficient integration scheme. Therefore, only two different growth processes may be applied during processing the carrier, wherein the thin gate insulation layer of the first type of field effect transistors may be grown as a single layer gate oxide, and wherein the thick gate insulation layer of the second type of field effect transistors may be grown as a double layer gate oxide having a greater thickness than the single layer gate oxide.

According to various embodiments, a split gate transistor structure (e.g. a so-called split-channel structure or a two-terminal one transistor split-channel structure), as described herein, may include a first split gate region and a second split gate region laterally next to the first split gate region, wherein the first split gate region includes a first split gate isolation layer (or a first split gate isolation layer structure or a first split gate oxide layer) separating a first portion of a gate structure over the first split gate isolation layer from a first body region (first channel region) in the carrier below the first split gate isolation layer, and wherein the second split gate region includes a second split gate isolation layer (or a second split gate isolation layer structure or a second split gate oxide layer) separating a second portion of the gate structure over the second split gate isolation layer from a second body region (second channel region) in the carrier below the second split gate isolation layer, wherein the thickness of the first split gate isolation layer may be different from the thickness of the second split gate isolation layer. Without loss of generality, the first split gate isolation layer in the first split gate region may be thicker than the second split gate isolation layer in the second split gate region, such that the first split gate isolation layer may be also referred to herein as thick split gate isolation layer and the second split gate isolation layer may be also referred to herein as thin split gate isolation layer for easier associating the terms. Further, without loss of generality, the gate isolation layer of the first type of field effect transistors may be thinner than the gate isolation layer of the second type of field effect transistors, such that the gate isolation layer of the first type of field effect transistors may be also referred to herein as thin gate isolation layer and the gate isolation of the second type of field effect transistors may be also referred to herein as thick gate isolation layer for easier associating the terms.

The thick split gate isolation layer (the thick split gate oxide layer) may provide a thick split gate isolation (a thick split gate oxide). Further, the thick split gate isolation layer may be a double layer and, therefore, the thick split gate oxide may include a first portion and a second portion over the first portion, or in other words, the thick split gate oxide may include a so-called dual (double) gate oxide. The thin split gate isolation layer (the thin split gate oxide layer) may provide a thin split gate isolation (a thin split gate oxide). Further, the thin split gate isolation layer may be a single layer and, therefore, the thin split gate oxide may include a single gate oxide. The thick gate isolation layer (the thick gate oxide layer) may provide a thick gate isolation (a thick gate oxide). Further, the thick gate isolation layer may be a double layer and, therefore, the thick gate oxide may include a first portion and a second portion over the first portion, or in other words, the thick gate oxide may include a so-called dual (double) gate oxide. The thin gate isolation layer may provide a thin gate isolation (a thin gate oxide). Further, the thin gate isolation layer may be a single layer and, therefore, the thin gate oxide may include a single gate oxide.

Illustratively, according to various embodiments, a method for processing a carrier may be provided herein, which allows growing silicon oxide from a silicon carrier with different growing speeds and, therefore, growing silicon oxide in different predefined areas of the carrier with different thicknesses by the same growth process. Thus, a thin gate oxide layer may be formed in a first region of the carrier and simultaneously a thin split gate oxide layer may be formed in a second region of the carrier by the very same growth process, wherein the thickness of the thin gate oxide layer may differ from the thickness of the thin split gate oxide layer. Moreover, a thick gate oxide layer (e.g. a double layer gate oxide) may be formed in a first region of the carrier and simultaneously a thick split gate oxide layer (e.g. a double layer split gate oxide) may be formed in a second region of the carrier by the very same growth process (e.g. by the very same two oxidation processes of the carrier performed successively), wherein the thickness of the thick gate oxide layer may differ from the thickness of the thick split gate oxide layer.

As a result, according to various embodiments, by performing exclusively two growth processes the first type of field effect transistors with a thin gate isolation layer and the second type of field effect transistors with a thick gate isolation layer may be provided over the carrier, and, simultaneously, a split gate field effect transistor structure with a thick split gate region and a thin split gate region may be provided over the carrier in a predefined area, wherein the thickness of a thick split gate isolation layer in the first split gate region is greater than the thick gate isolation layer of the second type of field effect transistors and wherein the thickness of a thin split gate isolation layer in the second split gate region is equal to or less than the thickness of the thin gate isolation layer of the first type of FETs.

Illustratively, according to various embodiments, the split gate transistor structure may be configured or may be operated as an antifuse-based OTP NVM, and the split gate isolation structure of the split gate transistor structure may be adapted to enhance the reliability of the antifuse-based OTP NVM. In other words, the thickness of the thick split gate isolation layer and thickness of the thin split gate isolation layer of the split gate transistor structure may be adapted to allow a reliable programming of the antifuse-based OTP NVM without changing the growth processes for growing the gate oxides for the first type of field effect transistors and the second type of field effect transistors from the carrier and without using additional growth processes. According to various embodiments, only two growth processes may be used to manufacture a chip or a die with the antifuse-based OTP NVM together with the first type of field effect transistors and the second type of field effect transistors, wherein the split gate transistor structure of the antifuse-based OTP NVM may be adapted by modifying the surface region of the carrier in which the antifuse-based OTP NVM is to be formed.

According to various embodiments, the growth of the split gate isolating layers may be modified in a predefined surface region of the carrier, e.g. the growth speed of the gate oxide may be enhanced compared to other surface regions of the carrier, by doping the predefined surface region of the carrier with fluorine.

According to various embodiments, the growth of the split gate isolating layers may be modified in a predefined surface region of the carrier, e.g. the growth speed of the gate oxide may be reduced compared to other surface regions of the carrier, by doping the predefined surface region of the carrier with nitrogen or by adding nitrogen into the oxidation process for forming the gate oxide from the carrier. According to various embodiments, a nitride or a nitride layer, e.g. silicon nitride or a silicon nitride layer, may be included in a gate oxide or a gate oxide layer structure. According to various embodiments, nitrogen may be included in the recipes for forming a gate oxide for restricting the growth of the gate oxide.

According to various embodiments, the growth of the split gate isolating layers of the split gate transistor structure may be modified in a predefined surface region of the carrier, e.g. the growth speed of the gate oxide may be enhanced and/or reduced compared to other surface regions of the carrier by doping the predefined surface region of the carrier with fluorine and/or nitrogen and/or by adding nitrogen into the oxidation process for forming the gate oxide from the carrier.

According to various embodiments, a gate oxide (silicon oxide) may be grown by thermally oxidizing the carrier (a silicon wafer or a silicon substrate or a silicon die) by means of a so-called thermal oxidation or a rapid thermal oxidation. According to various embodiments, the first growth process (e.g. to form a gate isolation layer over a carrier to provide a first portion of a thick gate isolation layer and to provide a first portion of a thick split gate isolation layer) may be a thermal oxidation of the carrier at a temperature in the range from about 500° C. to about 1000° C., e.g. in the range from about 650° C. to about 850° C., with an annealing duration in the range from about several minutes to about an hour, e.g. in the range from about 10 min to about 50 min, e.g. in the range from about 20 min to about 40 min. Further, the first growth process may be performed in an oxygen atmosphere. According to various embodiments, the second growth process (e.g. to form a thin gate isolation layer and a thin split gate isolation layer or to form an additional gate isolation layer over an already grown gate isolation layer to provide a second portion of a thick gate isolation layer and to provide a second portion of a thick split gate isolation layer) may be a thermal oxidation of the carrier at a temperature in the range from about 500° C. to about 1000° C., e.g. in the range from about 650° C. to about 850° C., with an annealing duration in the range from about several minutes to about an hour, e.g. in the range from about 10 min to about 50 min, e.g. in the range from about 20 min to about 40 min. Further, the second growth process may be performed in an oxygen or oxygen/nitrogen atmosphere. According to various embodiments, the second growth process may be performed at a higher temperature than the first growth process. Further, the second growth process may be performed with a shorter duration than the first growth process.

According to various embodiments, the first growth process may provide a gate oxide with a thickness in the range from about 2 nm to about 4 nm grown from a silicon surface and a thicker gate oxide if the gate oxide is grown from a fluorine doped silicon surface, e.g. with a thickness in the range from about 3 nm to about 5 nm. According to various embodiments, the second growth process may provide a gate oxide with a thickness in the range from about 1 nm to about 3 nm if the gate oxide is for example grown from a silicon surface to provide a thin gate oxide layer or a thin split gate oxide layer or if the gate oxide is for example grown over an already grown gate oxide to provide a thick gate oxide layer or a thick split gate oxide layer as a double layer gate oxide. Therefore, according to various embodiments, if a double layer gate oxide is grown from a silicon surface via the first growth process and via the second growth process, the double layer gate oxide may have a resulting final thickness in the range from about 3 nm to about 7 nm. Further, if a double layer gate oxide is grown from a fluorine doped silicon surface via the first growth process and via the second growth process, the double layer gate oxide may have a resulting final thickness in the range from about 4 nm to about 8 nm.

According to various embodiments, the gate oxide layers or the gate isolation layers may be patterned to provide the respective gate oxide.

Illustratively, according to various embodiments, the split gate transistor structure may be adapted to enhance the reliability of the split gate transistor structure used as antifuse-based OTP NVM. Therefore, according to various embodiments, the gate of a split gate transistor structure may be modified, e.g. the electrical conductivity (or the doping concentration) of a portion of the gate may be increased, so that the fusing of the antifuse-based OTP NVM may be more reliable. According to various embodiments, the portion of the gate disposed over the thin split gate oxide to be fused may be additionally doped or may be provided to have a greater electrical conductivity than the rest of the gate, e.g. than the portion of the gate disposed over the thick split gate oxide. According to various embodiments, the split gate transistor structure may be also referred to as OTP cell and the portion of the split gate transistor structure including the thin split gate oxide may be referred to as fuse cell of the OTP cell.

According to various embodiments, a split gate (split channel) field effect transistor structure may be configured as an antifuse-based OTP NVM (a so-called one-transistor (1T) bit-cell), wherein the thin split gate oxide may be fused to change the state of the antifuse-based OTP NVM by forming an electrically conductive path through the thin split gate oxide. According to various embodiments, an antifuse-based OTP NVM may be also configured as a two-transistor (2T) antifuse bit-cell including a programming transistor (e.g. a first MOSFET) and a select transistor (e.g. a second MOSFET).

The split gate (split channel) field effect transistor structure, as described herein, may fuse and work with a reliability of greater than 99.9%. Therefore, the split gate field effect transistor structure may be used in automotive electronics without error correction. In other words, the carrier with the split gate field effect transistor structure may not need a region for implementing error detection and correction.

FIG. 1 illustrates a split gate field effect transistor structure 100 in a schematic cross sectional view, wherein at least one (e.g. one or more) split gate field effect transistor 100t may be integrated into a carrier 102, according to various embodiments. The carrier 102 may include at least one of the following: a silicon wafer or a part of a silicon wafer, e.g. a die or a chip, or any other suitable carrier with a silicon surface layer 102. According to various embodiments, the carrier may be p-type doped, e.g. boron doped, or n-type doped, e.g. phosphorous doped. Therefore, according to various embodiments, the carrier 102 may provide the body region 102c (the channel 102c) of the split gate field effect transistor structure 100. Further, the carrier 102 may include a processing surface 102s on which the split gate field effect transistor structure 100 may be formed or at which the split gate field effect transistor structure 100 may be integrated in MOS technology. According to various embodiments, the split gate field effect transistor structure 100 may include a gate structure 106 (a gate) for controlling (e.g. for fusing, writing and/or reading) the split gate field effect transistor structure 100.

According to various embodiments, the split gate field effect transistor structure 100 may include a first split gate region over a first body region 102a (over a first portion of the channel 102c) and a second split gate region over a second body region 102b (over a second portion of the channel 102c). The first split gate region may include a thick split gate oxide 104a (e.g. a double layer gate isolation, e.g. a dual gate oxide) and a first gate portion 106a over the thick split gate oxide 104a. The second split gate region (the fuse cell) may include a thin split gate oxide 104b (e.g. a single layer gate isolation, e.g. a single gate oxide) and a second gate portion 106b over the thin split gate oxide 104b. Accordingly, the first gate portion 106a may control the first body region 102a (the conductivity of the channel below the first gate portion 106a) by providing an electrical field through the thick split gate oxide 104a.

Further, the second gate portion 106b may allow applying a voltage to break the thin split gate oxide 104b so that the second gate portion 106b may be electrically conductively connected to the channel 102c (e.g. to the second body region 102b). Illustratively, the split gate field effect transistor structure 100 may be in a first state (e.g. representing a first logic state, e.g. a "1") if the thin split gate oxide 104b electrically isolates the second gate portion 106b from the channel 102c, and the split gate field effect transistor structure 100 may be in a second state (e.g. representing a second logic state, e.g. a "0") if the thin split gate oxide 104b electrically connects the second gate portion 106b with the channel 102c. The state ("0" or "1") of the split gate field effect transistor structure 100 may be changed by applying a writing voltage at the thin split gate oxide 104b. The state ("0" or "1") of the split gate field effect transistor structure 100 may be read by applying a readout voltage between the gate structure 106 and the channel 102 (or between the gate structure 106 and a source/drain region in the carrier 102 adjacent to the first body region 102a).

According to various embodiments, the electrical conductivity of the second gate portion 106b may be greater than the electrical conductivity of the first gate portion 106a. Therefore, a greater voltage portion may drop over the thin split gate oxide 104b which may improve or which may allow fusing the split gate field effect transistor structure 100 by breaking the thin split gate oxide 104b, since also a greater current may flow through the thin split gate oxide 104b during the fusing process. Illustratively, the gate structure 106 may be adapted by changing the specific electrical conductivity locally over the thin split gate oxide 104b, which may for example allow to compensate a depletion in the gate structure 106 if a high writing voltage (e.g. larger than for example 5 V or in the range from about 5 V to about 12 V) is applied at the gate oxide structure 104a, 104b. As a result, less voltage may be necessary to break the thin split gate oxide 104b and therefore, the thick split gate oxide 104a may also be relieved during the fusing process. Since the electrical conductivity of the thin split gate oxide 104b may be greater after the fusing, this may be also referred to as antifuse.

According to various embodiments, the thickness (e.g. the extension along the direction 105) of the thin split gate oxide 104b may be in the range from about 1 nm to about 3 nm. However, the lower limit for the thickness of the thin split gate oxide 104b may be for example defined due to physical reasons of tunneling electrons so that the thin split gate oxide 104b may lose the ability to be changed from the first state to the second state. On that basis, the thickness of the thick split gate oxide 104a relative to the thickness of the thin split gate oxide 104b may influence current flow and voltage distribution in the split gate field effect transistor structure 100 which may influence the reliability of the split gate field effect transistor structure 100 during writing and reading. According to various embodiments, the ratio of the thickness of thick split gate oxide 104a relative to the thickness of the thin split gate oxide 104b may be larger than 2, e.g. larger than 3, e.g. in the range from about 1.5 to about 5.

According to various embodiments, the width (e.g. the extension along the lateral direction 101) of the split gate field effect transistor 100t may be in the range from about several nanometers to about one micrometer or more than one micrometer, e.g. in the range from about 10 nm to about 10 μm, e.g. in the range from about 20 nm to about 1 μm, e.g. in the range from about 20 nm to about 500 nm.

Figure 3:
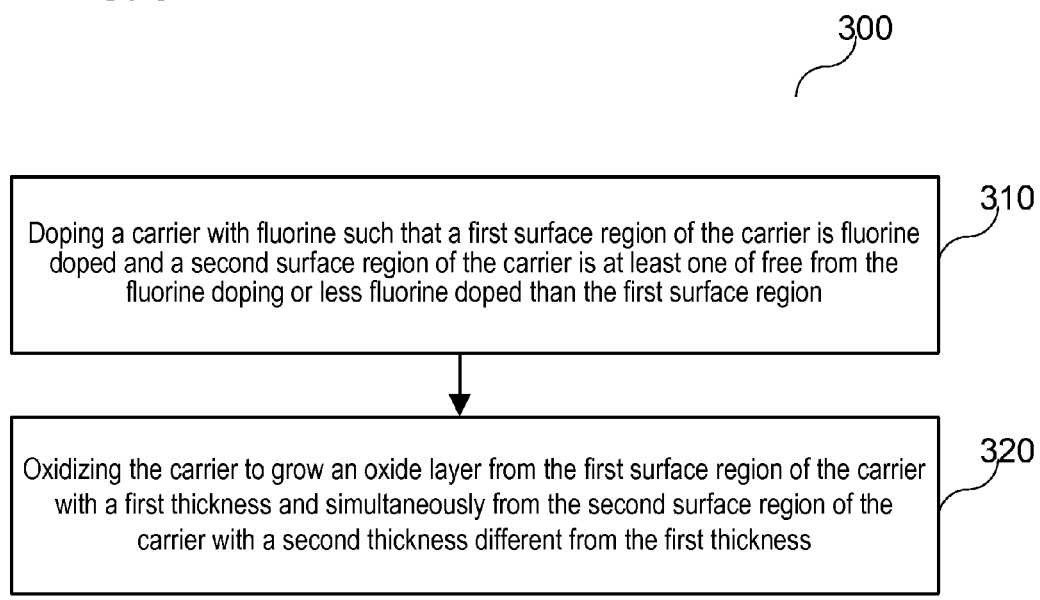
FIG. 3 shows a schematic flow diagram of a method for processing a carrier, according to various embodiments.
Figure 4A:
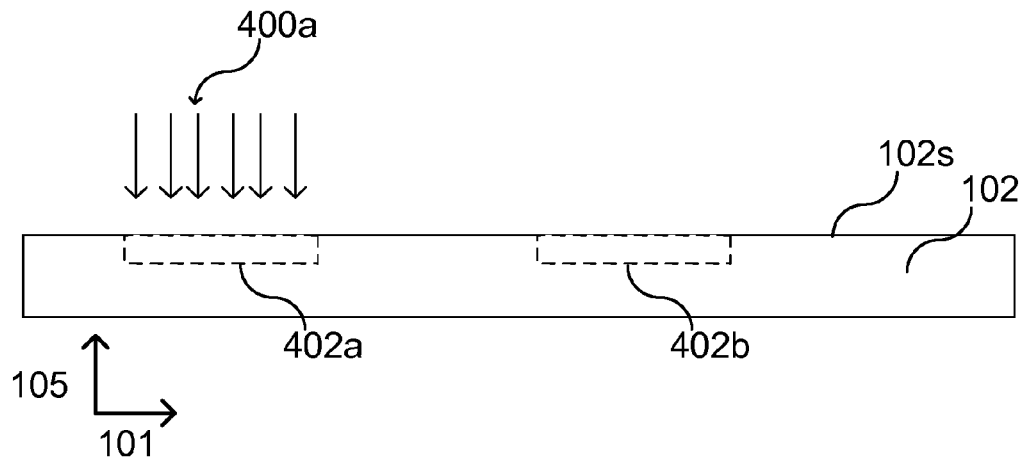
FIGS. 4A to 4E show, respectively, a schematic cross sectional view of a split gate field effect transistor structure on a carrier during manufacture, according to various embodiments.
Figure 4B:
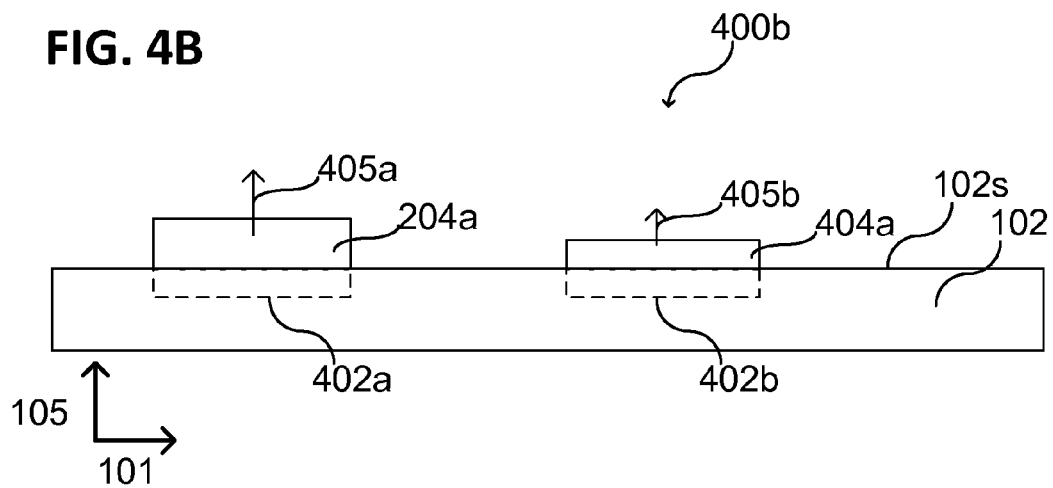
Figure 4C:
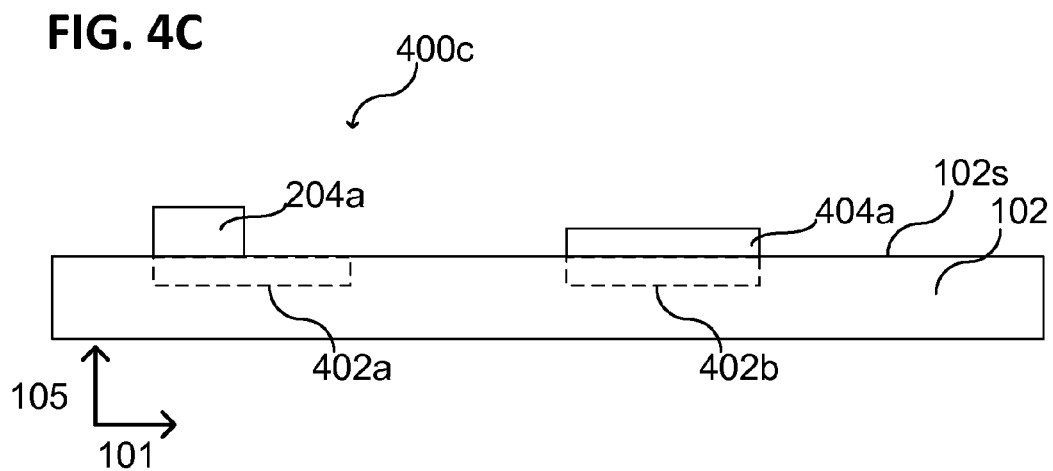
Figure 4D:
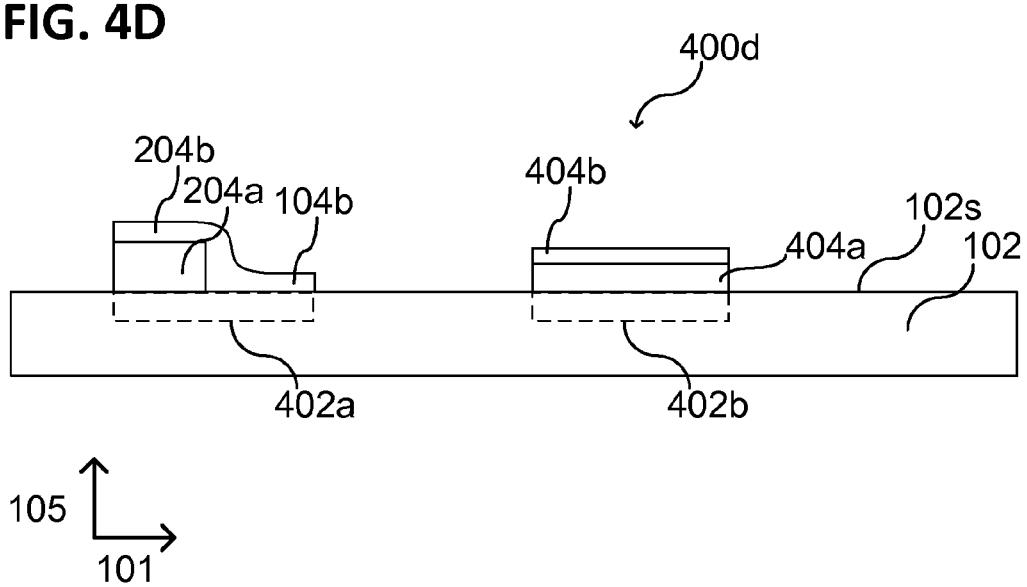

According to various embodiments, since the available gate oxide growth processes may be limited to the two processes used for the first type of transistors and the second type of transistors on the carrier 102 (cf. FIG. 5), the ratio of the thickness of thick split gate oxide 104a relative to the thickness of the thin split gate oxide 104b may be increased for providing a more reliable split gate field effect transistor structure 100 by locally influencing the growth of the gate oxide from the body region 102c (cf. for example FIG. 3 and FIG. 4D).

Various modifications and/or configurations of the split gate field effect transistor structure 100 and details referring to the split gate oxides 104a, 104b, the gate structure 106, and carrier 102 are described in the following, wherein the features and/or functionalities described with reference to FIG. 1 may be included analogously. Further, the features and/or functionalities described in the following may be included in the split gate field effect transistor structure 100 or may be combined with the split gate field effect transistor structure 100, as described before with reference to FIG. 1.

Figure 2A:
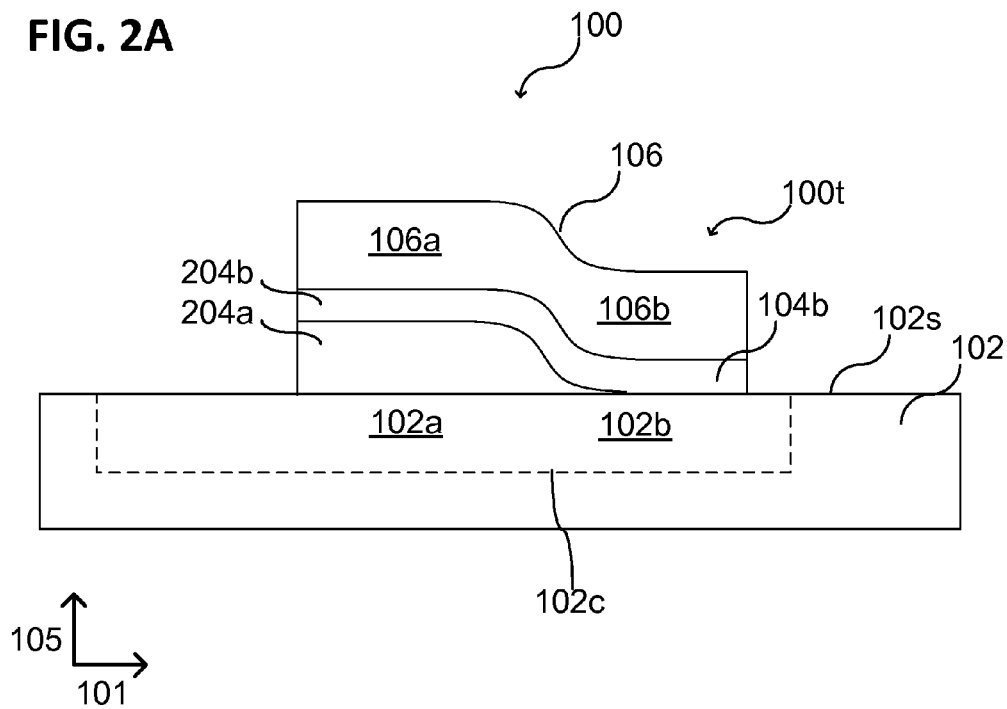

As illustrated in FIG. 2A, according to various embodiments, the thick split gate oxide 104a may be provided as a dual gate oxide, wherein two gate oxide layers 204a, 204b are provided as a layer stack. The first portion 204a of the thick split gate oxide 104a may be provided by the first growth process, wherein silicon oxide is grown by thermal oxidation from the (e.g. fluorine doped) silicon of the carrier 102. Further, the second portion 204b of the thick split gate oxide 104a may be grown over the first portion 204a of the thick split gate oxide 104a by the second growth process. Simultaneously, the thin split gate oxide 104b may be provided by the second growth process from the carrier 102.

According to various embodiments, after growing the first portion 204a of the thick split gate oxide 104a by the first growth process, the fluorine being doped into the surface region of the carrier 102 may be consumed (e.g. the fluorine may diffuse deeper into the substrate due to a provided thermal budget) such that the growth of the thin split gate oxide 104b may not be influenced by the fluorine doping of the carrier. According to various embodiments, a fluorine pre-implantation with a dose equal to or less than about $10^{15}$ cm$^{-2}$ may be consumed by the first growth process such that the second growth process may substantially not be influenced by the fluorine pre-implantation. Further, a fluorine pre-implantation with a dose greater than about $10^{15}$ cm$^{-2}$ (e.g. $3*10^{15}$ cm$^{-2}$) may not be consumed completely by the first growth process such that the second growth process may also be influenced by the fluorine pre-implantation. Further, the first growth process may be a wet oven oxidation process and the second growth process may be a dry oven oxidation process.

According to various embodiments, the thickness (e.g. the extension along the direction 105) of the first portion 204a of the thick split gate oxide 104a may be in the range from about 2 nm to about 6 nm, e.g. in the range from about 3 nm to about 5 nm. Further, the thickness (e.g. the extension along the direction 105) of the second portion 204b of the thick split gate oxide 104a and the thickness of the thin split gate oxide 104b may be in the range from about 1 nm to about 3 nm. According to various embodiments, the ratio of the thickness of thick split gate oxide 104a relative to the thickness of the thin split gate oxide 104b may be increased by fluorine doping the surface region of the carrier 102 before growing the first portion 204a of the thick split gate oxide 104a.

Further, as illustrated in FIG. 2B, a source/drain region 202sd may be provided in the carrier 102, according to various embodiments. The source/drain region 202sd may include the opposite doping type of the body region 102c or of the carrier 102. The carrier 102 or the body region 102c of the carrier 102 may be for example p-type doped and the source/drain region 202sd may be n-type doped. Alternatively, the carrier 102 or the body region 102c of the carrier 102 may be for example n-type doped and the source/drain region 202sd may be p-type doped. Further, the source/drain region 202sd may include a lightly doped drain region (LDD), according to various embodiments.

According to various embodiments, the gate structure 106a, 106b may include polysilicon, e.g. doped polysilicon. The gate structure 106a, 106b may be formed for example by doping the polysilicon provided over the split gate oxides 104a, 104b by ion implantation. The gate structure 106a, 106b may be doped by the same doping process as used for providing the source/drain region 202sd in the carrier 102. To enhance the electrical conductivity of the second gate portion 106b the first gate portion 106a may be masked and an additional ion implantation process may be carried out.

According to various embodiments, the split gate field effect transistor structure 100 may include a dielectric structure 202i in the carrier 102. The dielectric structure 202i may laterally confine the split gate field effect transistor 100t. Illustratively, more than one split gate field effect transistor 100t may be provided on the carrier 102, wherein respectively adjacent split gate field effect transistor 100t may be electrically separated from each other by the dielectric structure 202i. According to various embodiments, the dielectric structure 202i may include a shallow trench isolation (STI) and/or a deep trench isolation (DTI) laterally surrounding the body region 102c of the split gate field effect transistor 100t.

Further, according to various embodiments, the split gate field effect transistor structure 100 may include terminals 206, 208 to electrically contact the split gate field effect transistor 100t. As schematically illustrated in FIG. 2B, a source/drain terminal (electrode or contact) 208 may electrically contact the source/drain region 202sd and a gate terminal (electrode or contact) 206 may electrically contact the gate structure 106a, 106b of the split gate field effect transistor 100t.

According to various embodiments, in a first operating mode, the two terminals 206, 208 may be used to write data into the split gate field effect transistor 100t, e.g. by fusing (breaking) the thin split gate oxide 104b by applying a writing voltage at the terminals 206, 208. Further, in a second operating mode, the two terminals 206, 208 may be used to read the data from the split gate field effect transistor 100t, e.g. by applying a readout voltage less than the writing voltage at the terminals 206, 208. In this regard, the current through the split gate field effect transistor 100t may be larger if the split gate field effect transistor 100t is fused (e.g. if the thin split gate oxide 104b is broken such that the thin split gate oxide 104b may not electrically isolate the body region 102c from the gate structure 106a, 106b).

FIG. 2C illustrates a schematic cross sectional view of a split gate field effect transistor structure 100, according to various embodiments, wherein a side-wall spacer 210 is provided at the split gate field effect transistor 100t. As already described, the split gate field effect transistor structure 100 may include a source/drain region 202sd and a lightly doped drain region 2021dd laterally next to the first body region 102a.

FIG. 3 illustrates a schematic flow diagram of a method 300 for processing a carrier 102, according to various embodiments, wherein the method 300 may include: in 310, doping a carrier 102 with fluorine so that a first surface region of the carrier 102 is fluorine doped and a second surface region of the carrier 102 is at least one of free from the fluorine doping or less fluorine doped than the first surface region of the carrier 102; and, in 320, oxidizing the carrier 102 to grow a first gate oxide from the first surface region of the carrier 102 with a first thickness and simultaneously to grow a second gate oxide from the second surface region of the carrier 102 with a second thickness different from the first thickness. FIGS. 4A to 4E respectively illustrate the carrier 102 during processing, e.g. during method 300 is carried out, according to various embodiments.

FIG. 4A schematically illustrates the carrier 102 in a cross sectional view, wherein, according to various embodiments, the carrier 102 is partially doped with fluorine, e.g. by performing an ion implantation 400a to implant fluorine into a first surface region 402a of the carrier 102. The rest of the carrier 102 may be for example covered with masking material to prevent the implantation of fluorine outside the first surface region 402a of the carrier 102, e.g. in a second surface region 402b of the carrier 102 or in a further surface region of the carrier 102 (cf. FIG. 5).

According to various embodiments, the fluorine doping of the carrier 102 may include providing a fluorine doping concentration (e.g. a peak doping concentration) in the first surface region 402a greater than about $10^{14}$ cm$^{-3}$, e.g. in the range from about $10^{14}$ cm$^{-3}$ to about $10^{19}$ cm$^{-3}$, e.g. in the range from about $10^{14}$ cm$^{-3}$ to about $10^{18}$ cm$^{-3}$, e.g. in the range from about $10^{17}$ cm$^{-3}$. Further, the fluorine may be implanted with a dose of about $10^{15}$ cm$^{-2}$, with an implantation energy of about 15 keV, with zero tilt and zero twist. According to various embodiments, the fluorine doping of the carrier 102 may be influenced by the applied implantation process and the provided thermal budget. According to various embodiments, the fluorine implanted with a dose of about $10^{15}$ cm$^{-2}$ may lead to a final peak concentration of fluorine (after the gate oxides have been formed) of about $10^{17}$ cm$^{-3}$ in a depth of about 2 µm below the surface of the carrier 102. In this regard, the concentration of fluorine may be greater than the detection limit (e.g. $10^{12}$ cm$^{-3}$) of a SIMS analysis (secondary ion mass spectrometry).

According to various embodiments, the depth of the fluorine doped first surface region 402a of the carrier 102 may be in the range from about several nanometers to about several micrometers. According to various embodiments, the first surface region 402a of the carrier 102 may define the region of the wafer wherein the split gate field effect transistor structure 100 is to be formed, since the fluorine doping may enhance the growth speed of the first portion 204a of the thick split gate oxide 104a.

According to various embodiments, the carrier 102 may include fluorine impurities outside (next to) the first surface region 402a of the carrier 102. However, the fluorine doping concentration in the first surface region 402a may be greater (e.g. more than one order of magnitude or several orders of magnitude) than in the rest of the carrier 102 outside the first surface region 402a.

As illustrated in FIG. 4B, the first gate oxide 204a may be grown from the first surface region 402a of the carrier 102 by oxidizing the carrier 102, e.g. by performing the first growth process 400b, as already described. By the same first growth process 400b, a second gate oxide 404a may be grown from the second surface region 402b of the carrier 102 or a second gate oxide 404a may be grown outside the first surface region 402a of the carrier 102. Since a growth speed 405a for the first gate oxide 204a may be greater than a growth speed 405b for the second gate oxide 404a, the thickness of the first gate oxide 204a may be greater than the thickness of the second gate oxide 404a although the very same growth process 400b (oxidation process) has been applied.

As illustrated in FIG. 4C, according to various embodiments, the first gate oxide 204a may be partially removed (patterned) so that the first surface region 402a next to the remaining first gate oxide 204a is partially exposed.

After patterning the first gate oxide 204a, an oxide layer 204b, 104b may be formed over the partially exposed first surface region 402a of the carrier 102 and over the remaining first gate oxide 204a, as illustrated in FIG. 4D, according to various embodiments. Therefore, a second growth process 400d may be carried out, as already described, including for example oxidizing the carrier 102 to grow a third gate oxide 104b from the exposed first surface region 402a of the carrier 102 and to continue growing the patterned first gate oxide 204a to a dual gate oxide 204a, 204b.

Thus, according to various embodiments, a split gate oxide structure may be provided over the first surface region 402a of the carrier 102, which may be a part of a split gate field effect transistor structure 100 or a split gate field effect transistor 100t, as described herein. The split gate oxide structure may include a thick split gate oxide 204a, 204b (a dual layer gate oxide) and a thin split gate oxide 104b (a single layer gate oxide).

According to various embodiments, the second growth process 400d may include to further grow the second gate oxide 404a to provide a dual gate oxide 404a, 404b in the second surface region 402b. The dual gate oxide 404a, 404b in the second surface region 402b of the carrier 102 may provide the gate oxide structure of the second type of field effect transistors provided on the carrier 102, as described before.

Figure 4E:
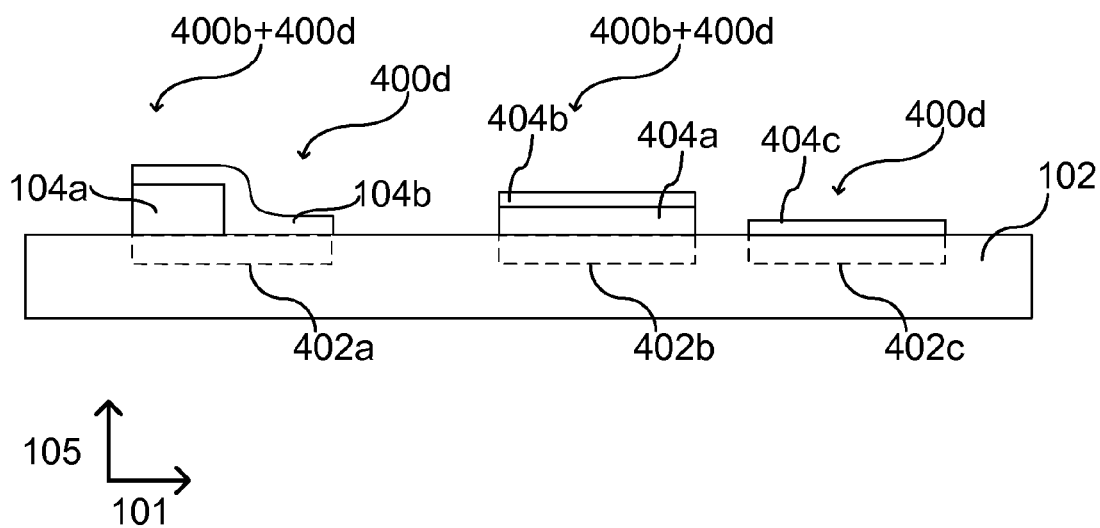

As illustrated in FIG. 4E, according to various embodiments, the second growth process 400d may include oxidizing the carrier 102 to grow a fourth gate oxide 404c from a third surface region 402c of the carrier 102. The single gate oxide 404c in the third surface region 402c of the carrier 102 may provide the gate oxide structure of the first type of field effect transistors provided on the carrier 102, as described before.

Illustratively, by performing the first growth process 400b and the second growth process 400d a split gate oxide structure 104a, 104b may be provided over the first surface region 402a of the carrier 102, the split gate oxide structure 104a, 104b including a thick (dual) split gate oxide 104a and the thin (single) split gate oxide 104b, and further, a thick (dual) gate oxide 404a, 404b may be provided for a second type of field effect transistors on the carrier 102 and a thin (single) gate oxide 404c may be provided for a first type of field effect transistors on the carrier 102.

Further, according to various embodiments, a gate structure may be provided over the split gate oxide structure 104a, 104b, over the thick (dual) gate oxide 404a, 404b for the second type of FETs, and over the thin (single) gate oxide 404c for the first type of FETs. This may be performed by depositing a polysilicon layer, patterning the deposited polysilicon layer, and doping the polysilicon layer. As already described, a source/drain structure may be provided for the split gate field effect transistor 100t, the first type of field effect transistors and the second type of field effect transistors.

Figure 5:
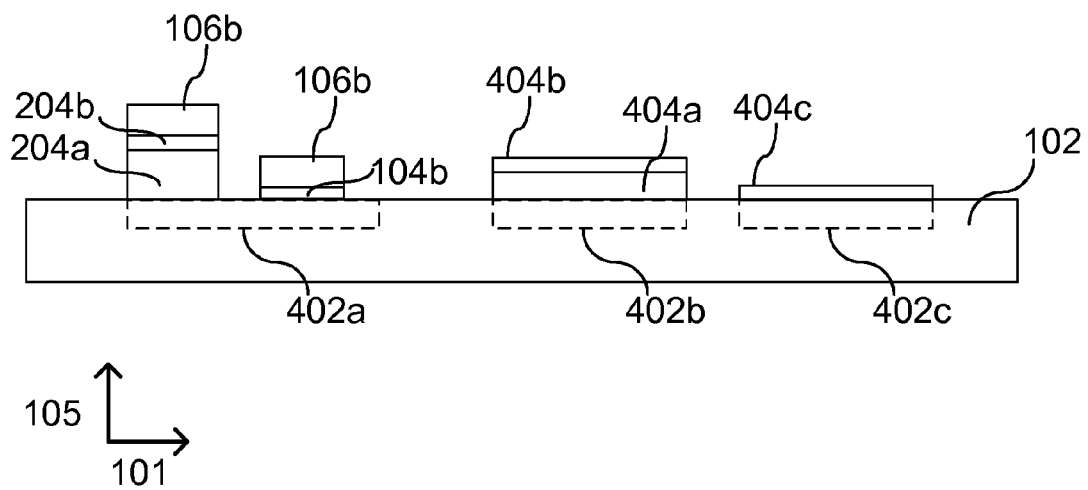
FIG. 5 shows a schematic cross sectional a carrier, according to various embodiments.

FIG. 5 illustrates a split gate field effect transistor structure 100 in a schematic cross sectional view, wherein the split gate field effect transistor structure 100 may be configured as an antifuse-based OTP NVM including a programming transistor with a thin split gate oxide 104b and a select transistor with a thick split gate oxide 204a, 204b.

Figure 6:
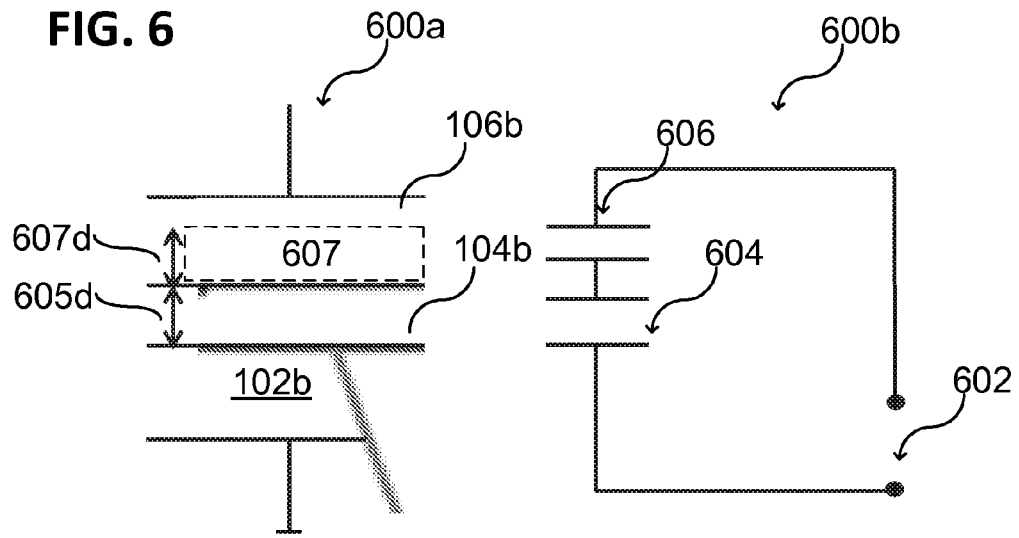
FIG. 6 shows a schematic sectional view of a split gate field effect transistor structure and a corresponding equivalent circuit diagram of the section of the split gate field effect transistor structure, according to various embodiments.

FIG. 6 shows a schematic view of a section 600a of a split gate field effect transistor structure 100 and a corresponding equivalent circuit diagram 600b of the section 600a of the split gate field effect transistor structure 100, according to various embodiments. As already described, the split gate field effect transistor structure 100 may include a thin split gate oxide 104b with a thickness 605d disposed over the second body region 102b (over the first surface region 402a) of the carrier 102, wherein the thin split gate oxide 104b is covered with doped polysilicon as gate 106b over the thin split gate oxide 104b. For breaking the thin split gate oxide 104b a (writing) voltage 602 may be applied at the thin split gate oxide 104b, wherein, due to the voltage 602 (e.g. greater than 3 V) the doped polysilicon of the gate 106b may be partially depleted. Illustratively, a depletion region 607 may be formed in the doped polysilicon of the gate 106b with a thickness 607d, and, as a result, the thin split gate oxide 104b may be more difficult to break or, in other words, the thin split gate oxide 104b may not break reliable if the a (writing) voltage 602 is applied. As illustrated in the equivalent circuit diagram 600b, the thin split gate oxide 104b and the depleted region 607 of the gate 106b may act as two capacities 604, 606 in series. In case of a substantial poly depletion a significant voltage drop of the fuse voltage occurs in the poly. The voltage drop over the thin split gate oxide may be not sufficient for a proper (reliable) fuse of the 1T bit-cells (the split channel antifuse-based OTP NVM).

For a more reliable fusing the poly depletion (of the gate 106b in the OTP fuse cell area) can be reduced without an impact to other parts of the technology/chip, e.g. without affecting the FETs outside the first surface region 402a.

According to various embodiments, the polysilicon (poly) of the gate 106b over the thin split gate oxide 104b (in the OTP fuse cell area) may be doped to prevent the formation or to reduce the thickness of the depleted region 607 in the gate 106b.

Illustratively, an additional local implant (e.g. a p-type doping if the channel is n-type and the rest of the gate is also p-type doped) into the poly gate 106b of the fuse area of the OTP cell may be carried out. The fuse cell may be referred to as the part of the split gate field effect transistor 100t with the thin split gate oxide 104b and the fuse area the thin split gate oxide 104b.

However, the poly depletion in the OTP cell may be influenced without impacting all the other, e.g. without changing the dose of the global source/drain implant which may be used to dope the gate 106a, 106b of the split gate field effect transistor 100t as well. Changing the dose of the global source/drain implant would for example affect the threshold voltages of all other devices (FETs) on the carrier 102. Further, the modification of the thermal budget after the global source/drain implant would affect all other devices and a formation of a salicide (e.g. for a contact formation).

Figure 7:
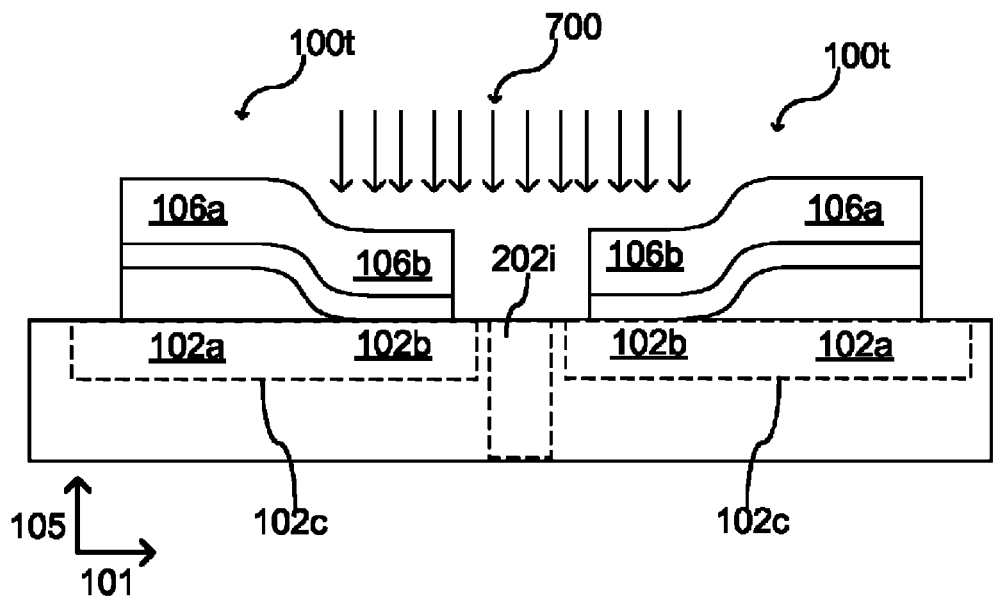
FIG. 7 shows a schematic cross sectional view of a carrier including two adjacent split gate field effect transistor structures during manufacture, according to various embodiments.

FIG. 7 illustrates a split gate field effect transistor structure 100 with two adjacent split gate field effect transistors 100t, e.g. in a PROM-region of a carrier 102, e.g. of a chip 102, according to various embodiments. According to various embodiments, an ion implantation 700 may be carried out to locally dope the respective second gate portions 106b over the thin split gate oxides 104b of the split gate field effect transistors 100t. According to various embodiments, a mask may be provided over the carrier 102 defining (exposing) the gate portions 106b over the thin split gate oxides 104b to enhance the electrical conductivity of the gate portions 106b.

For this additional implant 700 positive charged ions may be used. Further, according to various embodiments, the dose of the additional implant (e.g. used in the implantation recipe) may be adjusted in the range from about $5*10^{14}$ cm$^{-2}$ to about $1*10^{16}$ cm$^{-2}$, e.g. depending on the ultimate poly depletion of the process. The implant may be verified by measuring the electrical oxide thickness of the fuse part of the OTP cell in comparison the electrical oxide thickness of a regular logic transistor with the same physical gate oxide thickness. Further, according to various embodiments, the additional implant may result in a final doping concentration in the poly gate of about $1*10^{21}$ cm$^{-3}$ (e.g. in a final doping concentration near the respective solubility limit).

Figure 8:
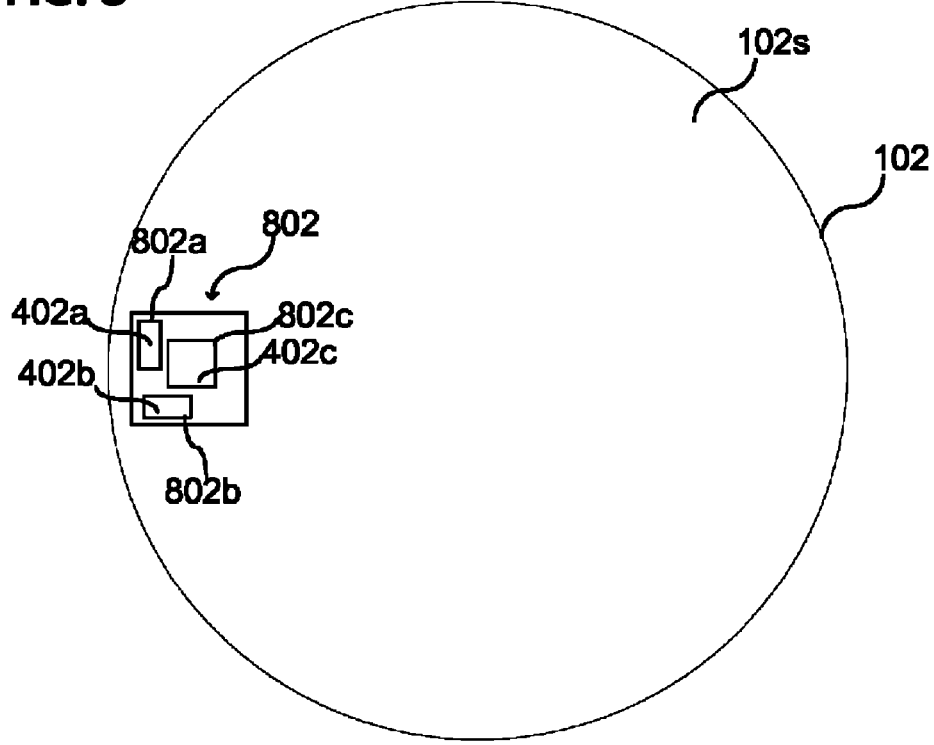
FIG. 8 shows a schematic top view of a carrier, according to various embodiments.

FIG. 8 illustrates a carrier 102 with a main processing surface 102s in a top view, e.g. during processing. The carrier 102 may be a wafer, e.g. a silicon wafer. The wafer 102 may include chip regions or die regions 802 to manufacture a plurality of chips or dies from the wafer 102. According to various embodiments, a chip region 802 (or the carrier 102) may include a core region (a first carrier region) 802c in which a plurality of FETs from the first type are to be processed, e.g. CMOS logic as core of the chip. Further, the chip region 802 may include an OTP area (a third carrier region) 802a for processing the split gate field effect transistor structure 100 or for processing a plurality of split gate field effect transistors 100t, e.g. to provide a PROM on the chip. Further, the chip region 802 may include peripheral region (a second carrier region) 802b in which a plurality of FETs from the second type are to be processed, e.g. a CMOS based I/O region as periphery of the core of the chip. According to various embodiments, the wafer 102 may include a plurality of chip regions 802.

In comparison for example to FIGS. 4A to 4E and FIG. 5, the first carrier region 802c may include the third surface region 402c, the second carrier region 802b may include the second surface region 402b, and/or the third carrier region 802a may include the first surface region 402a. In other words, the first surface region 402a may be provided in the third carrier region 802a, the second surface region 402b may be provided in the second carrier region 802b, and the third surface region 402c may be provided in the first carrier region 802c.

According to various embodiments, the split gate field effect transistor structure 100 in the OTP area 802a (OTP cell area 802a) may be provided with a different gate oxide thickness than a field effect transistor in another region when the same oxidation processes are applied to grow the oxides. Therefore, a pre-implantation of fluorine into the OTP area 802a may be applied. Further, a pre-implantation of nitrogen into all areas of the chip may be applied except in the OTP area 802a. According to various embodiments, a subsequently performed oven process (thermal oxidation) for thin gate oxides and thick gate oxides will result in a reduced thickness of the thin oxide in the OTP area 802a of the chip and increased thickness of the thick oxide in the OTP area 802a of the chip.

According to various embodiments, the OTP area 802a may further include regions for forming a dual gate oxide and regions for forming a single gate oxide for the respective split gate field effect transistor structure 100, wherein the fluorine may be implanted into the regions of the OTP area 802a for forming the dual gate oxide and wherein nitrogen may be implanted into the regions of the OTP area 802a for forming the single gate oxide.

According to various embodiments, additionally other processes may be applied as commonly used in CMOS processing, e.g. a thermal annealing may be used (e.g. a thermal budget may be provided) to activate implanted ions. Further, patterning and layering processes may be applied and for example patterned mask layers may be provided during the processing to form the desired structures on the carrier.

According to various embodiments, a 1T (one transistor) split channel OTP architecture is provided herein, which is configured antifuse-based. The bits may be reliably programmed through a controlled, non-reversible oxide breakdown in the bit cell of the 1T split channel OTP architecture. Integrating such an 1T split channel OTP architecture into an already established technology may allow for example the use of only two available gate oxides (of logic devices): e.g. a thin gate oxide of for example about 2.2 nm and thick gate oxide of for example about 5.2 nm or e.g. of any other two specific thicknesses for the thin gate oxide and the thick gate oxide.

According to various embodiments, it may be desired to have lower values than 2.2 nm for the thin gate oxide in the OTP cell, which may allow obtaining a lower voltage for fusing the OTP cell and a more stable fusing due to a more stable percolation path. Further, according to various embodiments, it may be desired to have higher values than 5.2 nm for the thick gate oxide in the OTP cell: e.g. in the range from about 7 nm to about 8 nm the likelihood for trap assisted tunneling may be decreased. Various embodiments may be based on the knowledge that the optimum of the oxides used in a fuse application may be different to the gate oxides of the regular logic devices of a technology. However, an introduction of further oxides just for an optimized fuse application may be expensive and may shift the thermal budget and/or may affect the devices of an already existing technology.

According to various embodiments, a modified process flow may be applied to generate optimized oxides for a fuse application without impact to thermal budget of the already existing technology and without introduction of new oxides (e.g. without introducing a third thermal oxidation process). Therefore, according to various embodiments, the oxide growing may be modified locally by pre-implantation of nitrogen and/or fluorine. With nitrogen a decelerated and with fluorine an accelerated growth in the later oxide oven process may be reached. The impact of nitrogen pre-implantation is given only for wet oven oxidation. The impact of fluorine pre-implantation is given only for wet oven oxidations (e.g. using water or another liquid as oxidizer) and dry oven oxidations (e.g. using gaseous oxygen or another gas as oxidizer).

According to various embodiments, an additional lithography process may be applied in an already established technology to provide a block mask for a subsequent implantation step. Using the block mask a local implantation of nitrogen or fluorine may be carried out. Accordingly, a decelerated or accelerated oxygen growth may be obtained during the oven process in those areas resulting in modified oxide thicknesses. The fluorine pre-implantation may improve the oxide quality. The process flow (the pre-implantation of nitrogen and/or fluorine) may be verified by a SIMS (secondary ion mass spectrometry) analysis (for concentrations greater than about $10^{12}$ cm$^{-3}$).

According to various embodiments, the processing, as described herein, may allow to provide optimized oxide thicknesses for a fuse application independent from the oxides of the logic devices of the base process. This can be reached without impact to the thermal budget of the base technology and without introduction of new oxide deposition. With an optimized thin oxide in the fuse application (in the fuse cell), the fuse voltage may be reduced. Further, the fuse process itself may be more stable, resulting for example in a reduced failure rate and a higher reliability and/or a stable fuse behavior in a wide temperature range, e.g. in the range from about −50° C. to about 150° C. Further, with an optimized thick oxide in the fuse application, the generated fuse voltage can be increased or the suitable fuse voltage may be increased. The access device (with the thick split gate oxide) of the 1T split channel OTP architecture may be more stable against parasitic leakage paths during the fuse process.

According to various embodiments, a 1T split channel OTP architecture (a split gate field effect transistor structure 100) may be integrated into an already established technology including FETs in CMOS technology, wherein only two available gate oxides (of logic devices) may be available for manufacture of the 1T split channel OTP architecture and the FETs on a carrier: e.g. two gate oxide processes may be applied for manufacturing a thin gate oxide and a thick gate oxide.

However, there may be the case that the two available gate oxide processes may per se not allow the manufacture of a reliable OTP cell, wherein for example the OTP cell may be more stable and/or more reliable with a thicker thick gate oxide (e.g. a thicker dual layer split gate oxide) and a thinner thin gate oxide (e.g. a thinner single layer split gate oxide). According to various embodiments, regions in the OTP area of the carrier (e.g. the second body region 102b in the first surface region 402a of the carrier 102) which should have a thinner gate oxide thickness may be subjected to a nitrogen pre-implantation. Further, according to various embodiments, regions in the OTP area of the carrier (e.g. the first body region 102a in the first surface region 402a of the carrier 102) which should have a thicker gate oxide thickness may be subjected to a fluorine pre-implantation. Therefore, the gate oxide oven process may be slowed and/or accelerated which may result in locally different thicknesses for the grown gate oxide. Therefore, according to various embodiments, the thin split gate oxide and the thick split gate oxide of the OTP cell (the split gate field effect transistor structure 100) may be provided independently of the underlying process.

In general, the poly of the gate of a field effect transistor may be manufactured as follows: the poly may be deposited over the gate oxide, the poly may be doped (e.g. in the same implantation process used for providing the source/drain regions), a thermal budget may be applied and/or the poly may be patterned. Therefore, the properties of the gate may depend on the following: the doping, the thermal budget and the structure of the poly (e.g. the grain size). For higher salicid anneal temperatures a deactivation of the dopants may take place related to higher poly depletion in case of an applied voltage. During fusing of the OTP cell, a high voltage of up to 8 V may be applied to the gate (e.g. as a so called programming pulse with a pulse duration in the range from about several nanoseconds to about one hundred nanoseconds). By this high voltage a large poly depletion layer may be formed involved with a high voltage drop already in the poly of the gate. As a result, the remaining voltage drop over the thin gate oxide may be not sufficient to fuse (to break) the thin gate oxide. Further, according to various embodiments, the programming pulse for fusing the OTP cell may be too short to allow an inversion of the poly gate which may occur at voltages greater than about 4 V or greater than about 5 V. For a large storage capacity or programming content short programming pulses may be desired for a time efficient programming. Therefore, avoiding or at least reducing the depletion of the poly gate may be relevant for the programming of the OTP cell.

If an OTP (one time programmable) cell built up, e.g. including a polysilicon to silicon oxide contact, may be introduced into an already existing process a high poly depletion may occur if high fuse voltages are applied. During the fuse process a part of the fuse voltage will already drop in this depletion and the effective resulting fuse voltage for the oxide is reduced (e.g. at least for short programming pulses with a duration less than about 100 ns). As a result, the fuse voltage has to be increased in this case to fuse the fuse cell of the OTP cell. However, if the periphery of the OTP cell may not allow increasing the fuse voltage further, the design of the OTP memory macro has to be changed, e.g. to allow the application of higher fuse voltages. This may require in general a larger area of the macro or the use of periphery devices suited for higher voltages.

According to various embodiments, the poly depletion in the OTP fuse cell may be prevented by an additional process step during manufacture of the OTP fuse cell. This may be done without impacting other parts of the chip area. Further, the OTP design may not be changed, e.g. since the application of a higher fuse voltage may not be required. The additional process step can be adapted to individual process conditions for poly depletion to prevent or reduce the poly depletion. The additional process step may include a local implantation into the polysilicon of the fuse to increase the dopant concentration of the polysilicon and to prevent the formation of a depleted zone during high fuse voltage application. According to various embodiments, the poly depletion and the related voltage drop in this area during the fusing of the OTP cell may be avoided or reduced.

According to various embodiments, by micro probing of the fuse part of the OTP cell the electrical gate oxide thickness can be determined. This value may be compared with that of a regular transistor with the same physical gate oxide thickness. The electrical gate oxide thickness of the OTP cell with reduced poly depletion may be lower and fits better to the physical thickness driven value.

According to various embodiments, a method for processing a carrier may include: doping the carrier with fluorine such that a first surface region of the carrier is fluorine doped and a second surface region of the carrier is at least one of free from the fluorine doping or less fluorine doped than the first surface region; and oxidizing the carrier to grow a first gate oxide from the first surface region of the carrier with a first thickness and simultaneously to grow a second gate oxide from the second surface region of the carrier with a second thickness different from the first thickness.

According to various embodiments, a method for processing a carrier may include: doping the carrier with fluorine such that a first surface region of the carrier is fluorine doped and a second surface region of the carrier is free from the fluorine doping; and oxidizing the carrier to grow a first gate oxide from the first surface region of the carrier with a first thickness and simultaneously to grow a second gate oxide from the second surface region of the carrier with a second thickness different from the first thickness. According to various embodiments, a method for processing a carrier may include: doping the carrier with fluorine such that a first surface region of the carrier is fluorine doped and a second surface region of the carrier is less fluorine doped than the first surface region; and oxidizing the carrier to grow a first gate oxide from the first surface region of the carrier with a first thickness and simultaneously to grow a second gate oxide from the second surface region of the carrier with a second thickness different from the first thickness.

According to various embodiments, the method for processing a carrier may further include partially removing the first gate oxide to expose the first surface region next to a remaining portion of the first gate oxide.

According to various embodiments, the method for processing a carrier may further include growing an oxide layer over the exposed first surface region of the carrier and over the remaining portion of the first gate oxide.

According to various embodiments, growing an oxide layer may include oxidizing the carrier to grow a third gate oxide from the exposed first surface region of the carrier and to continue growing the remaining portion of the first gate oxide.

According to various embodiments, growing an oxide layer may include oxidizing the carrier to continue growing the second gate oxide.

According to various embodiments, growing an oxide layer may include oxidizing the carrier to grow an additional gate oxide from a third surface region of the carrier.

According to various embodiments, the method for processing a carrier may further include forming a source/drain region in the carrier next to the first surface region and forming an electrically conductive gate structure over the oxide layer to provide a split gate transistor structure.

According to various embodiments, doping the carrier with fluorine may include providing a fluorine doping concentration in the first surface region greater than about $10^{14}$ $cm^{-3}$. According to various embodiments, doping the carrier with fluorine may include providing a fluorine doping concentration in the first surface region in the range from about $10^{13}$ $cm^{-3}$ to about $10^{19}$ $cm^{-3}$. According to various embodiments, doping the carrier with fluorine may include implanting fluorine with a dose greater than about $10^{13}$ $cm^{-2}$, e.g. with a dose in the range from about $10^{13}$ $cm^{-2}$ to about $10^{17}$ $cm^{-2}$, e.g. with a dose in the range from about $10^{14}$ $cm^{-2}$ to about $10^{16}$ $cm^{-2}$.

According to various embodiments, a carrier may include: a first carrier region (cf. the core region 802c illustrated in FIG. 8), a second carrier region (cf. the peripheral region 802b illustrated in FIG. 8), and a third carrier region (cf. the OTP area 802a illustrated in FIG. 8) respectively next to each other; a first field effect transistor in the first carrier region, the first field effect transistor including a first single layer gate isolation having a first thickness; a second field effect transistor in the second carrier region, the second field effect transistor including a first double layer gate isolation having a second thickness; and a split gate field effect transistor structure in the third carrier region; the split gate field effect transistor structure including: a first split gate region and a second split gate region; a second double layer gate isolation in the first split gate region, and a second single layer gate isolation in the second split gate region; the second double layer gate isolation having a third thickness greater than the second thickness and the second single layer gate isolation having a fourth thickness equal to or less than the first thickness.

According to various embodiments, the carrier may be p-type doped with acceptors from Group-III elements (e.g. boron, aluminum, gallium, indium) or n-type doped with donors from Group-V (e.g. phosphorous, arsenic, antimony) elements.

According to various embodiments, the third carrier region may be fluorine doped, and wherein the first carrier region and the second carrier region are at least one of free from the fluorine doping or less fluorine doped than the third surface region. According to various embodiments, a (first) surface region of the third carrier region may be fluorine doped, and wherein a (third) surface region the first carrier region and a (second) surface region the second carrier region are at least one of free from the fluorine doping or less fluorine doped than the third surface region.

According to various embodiments, the first thickness of the first single layer gate isolation may be less than about 3.5 nm.

According to various embodiments, the second thickness of the first double layer gate isolation may be greater than about 3.5 nm.

According to various embodiments, the ratio of the third thickness of the second double layer gate isolation to the fourth thickness of the second single layer gate isolation may be greater than about 2.

According to various embodiments, the split gate field effect transistor structure may be configured as one-time programmable fuse, wherein the second split gate region provides the programming area (the fuse cell).

According to various embodiments, a split gate field effect transistor structure may include: a channel including a first body region and a second body region, a first split gate isolation layer structure disposed over a first body region of the channel and having a first thickness, a second split gate isolation layer structure disposed over a second body region of the channel and having a second thickness, wherein the second thickness is less than the first thickness; a gate including a first gate portion disposed over the first split gate isolation layer structure and a second gate portion disposed over the second split gate isolation layer structure; wherein an electrical conductivity of the second gate portion is greater than the electrical conductivity of the first gate portion.

According to various embodiments, the channel of the split gate field effect transistor structure may be provided in the third carrier region 802a. Or in other words, the channel of the split gate field effect transistor structure may be provided in the first surface region 402a of the carrier.

According to various embodiments, the first gate portion may include a semiconductor material with a first doping concentration and the second gate portion may include a semiconductor material with a second doping concentration, wherein the second doping concentration is greater than the first doping concentration.

According to various embodiments, the first split gate isolation layer structure may include a double layer gate isolation with the first thickness in the range from about 4 nm to about 10 nm, and the second split gate isolation layer structure may include a single layer gate isolation with the second thickness in the range from about 1 nm to about 3 nm.

According to various embodiments, the ratio of the first thickness to the second thickness may be greater than about 2.

According to various embodiments, the split gate field effect transistor structure may be configured as a one-time programmable fuse, wherein the second split gate region provides the programming area.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A carrier comprising:
    a first carrier region, a second carrier region, and a third carrier region respectively next to each other;
    a first field effect transistor in the first carrier region, the first field effect transistor comprising a first single layer gate isolation having a first thickness;
    a second field effect transistor in the second carrier region, the second field effect transistor comprising a first double layer gate isolation having a second thickness; and
    a split gate field effect transistor structure in the third carrier region; the split gate field effect transistor structure comprising:
    a first split gate region and a second split gate region; a second double layer gate isolation in the first split gate region, and a second single layer gate isolation in the second split gate region; the second double layer gate isolation having a third thickness greater than the second thickness and the second single layer gate isolation having a fourth thickness equal to or less than the first thickness,
    wherein the third carrier region is fluorine doped, and
    wherein the first carrier region and the second carrier region are at least one of free from the fluorine doping or less fluorine doped than the third surface region.

2. The carrier of claim 1,
    wherein the carrier is at least one of p-type doped with acceptors from Group III elements or n-type doped with donors from Group V elements.

3. The carrier of claim 1, wherein a fluorine doping concentration in the third carrier region greater than about $10^{14}$ cm$^{-3}$.

4. The carrier of claim 1, wherein a fluorine doping concentration in the third carrier region is in the range from about $10^{13}$ cm$^{-3}$ to about $10^{19}$ cm$^{-3}$.

5. The carrier of claim 1,
    wherein the first thickness of the first single layer gate isolation is less than about 3.5 nm.

6. The carrier of claim 1,
    wherein the second thickness of the first double layer gate isolation is greater than about 3.5 nm.

7. The carrier of claim 1,
    wherein the ratio of the third thickness of the second double layer gate isolation to the fourth thickness of the second single layer gate isolation is greater than about 2.

8. The carrier of claim 1,
    wherein the split gate field effect transistor structure is configured as a one-time programmable device, wherein the second split gate region provides the programming area.

\* \* \* \* \*